US009455203B2

(12) United States Patent
Ando et al.

(10) Patent No.: US 9,455,203 B2
(45) Date of Patent: Sep. 27, 2016

(54) LOW THRESHOLD VOLTAGE CMOS DEVICE

(71) Applicants: International Business Machines Corporation, Armonk, NY (US); Global Foundries Inc, Grand Cayman, KY (US)

(72) Inventors: Takashi Ando, Tuckahoe, NY (US); Changhwan Choi, Seoul (KR); Kisik Choi, Watervliet, NY (US); Vijay Narayanan, New York, NY (US)

(73) Assignees: International Business Machines Corporation, Armonk, NY (US); Global Foundries Inc., Grand Cayman (KY)

( * ) Notice: Subject to any disclaimer, the term of this patent is extended or adjusted under 35 U.S.C. 154(b) by 0 days.

(21) Appl. No.: 14/992,739

(22) Filed: Jan. 11, 2016

(65) Prior Publication Data

US 2016/0126145 A1 May 5, 2016

Related U.S. Application Data

(62) Division of application No. 14/564,603, filed on Dec. 9, 2014, now Pat. No. 9,263,344, which is a division of application No. 13/327,870, filed on Dec. 16, 2011, now Pat. No. 8,941,184.

(51) Int. Cl.

| | |
|---|---|
| ***H01L 21/8238*** | (2006.01) |
| ***H01L 21/28*** | (2006.01) |
| ***H01L 29/49*** | (2006.01) |
| ***H01L 29/51*** | (2006.01) |
| ***H01L 29/66*** | (2006.01) |
| ***H01L 21/02*** | (2006.01) |
| ***H01L 29/161*** | (2006.01) |
| ***H01L 29/10*** | (2006.01) |

(52) U.S. Cl.

CPC . *H01L 21/823842* (2013.01); *H01L 21/02178* (2013.01); *H01L 21/02192* (2013.01); *H01L 21/28079* (2013.01); *H01L 21/28088* (2013.01); *H01L 21/28229* (2013.01); *H01L 21/823807* (2013.01); *H01L 21/823857* (2013.01); *H01L 29/1054* (2013.01); *H01L 29/161* (2013.01); *H01L 29/495* (2013.01); *H01L 29/4966* (2013.01); *H01L 29/517* (2013.01); *H01L 29/66545* (2013.01)

(58) Field of Classification Search

USPC .......... 257/369, E29.132, E21.429, E21.625, 257/E21.639, 213, 332

See application file for complete search history.

(56) References Cited

U.S. PATENT DOCUMENTS

2006/0121678 A1* 6/2006 Brask ................ H01L 21/28079 438/287
2010/0197128 A1* 8/2010 Schaeffer ........ H01L 21/823807 438/591
2011/0156166 A1* 6/2011 Huang ............. H01L 21/28247 257/392

*Primary Examiner* — Mohammad Islam
*Assistant Examiner* — Ratisha Mehta
(74) *Attorney, Agent, or Firm* — Law Offices of Ira D. Blecker, P.C.

(57) ABSTRACT

A replacement metal gate process in which a high-k dielectric is applied. The high-k dielectric may be doped with lanthanum in an NMOS region or aluminum in a PMOS region. A dummy gate structure may be formed over the high-k dielectric and etched to form an opening over the NMOS region and an opening over the PMOS region. Thereafter, first work function metals are deposited in the NMOS opening and second work function metals are applied in the PMOS openings. A suitable gate electrode material may then fill the remainder of the NMOS and PMOS openings.

20 Claims, 8 Drawing Sheets

200 232 228 214 230 232 226 216 226 222 224 204 NMOS PMOS 206 202

LOW THRESHOLD VOLTAGE CMOS DEVICE

BACKGROUND

The exemplary embodiments relate to semiconductor devices and, more particularly, to complementary metal oxide semiconductor (CMOS) devices with dual gate dielectrics and dual-metal gate structures and fabrication methods therefor.

Semiconductor devices are used in a variety of electronic applications, such as personal computers, cell phones, digital cameras, and other electronic equipment, as examples. Semiconductor devices are typically fabricated by sequentially depositing insulating (or dielectric) layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET).

Early MOSFET processes used one type of doping to create either positive or negative channel transistors. More recent designs, referred to as complimentary MOS (CMOS) devices, use both positive and negative channel devices, e.g., a positive channel metal oxide semiconductor (PMOS) transistor and a negative channel metal oxide semiconductor (NMOS) transistor, in complimentary configurations. A PMOS transistor may also be referred to as a PMOSFET or PFET while an NMOS transistor may be referred to as an NMOSFET or NFET. An NMOS device negatively charges so that the transistor is turned on or off by the movement of electrons, whereas a PMOS devices involves the movement of electron vacancies. While the manufacture of CMOS devices requires more manufacturing steps and more transistors, CMOS devices are advantageous because they utilize less power, and the devices may be made smaller and faster.

Dual work function gates are advantageously used in semiconductor devices having both PMOS and NMOS transistors. Some work functions that enable optimal operation of both PMOS and NMOS transistors are required. The optimal work function for a metal gate electrode will differ depending upon whether it is used to form an NMOS transistor or a PMOS transistor. For this reason, when the same material is used to make metal gate electrodes for NMOS and PMOS transistors, the gate electrodes do not demonstrate the desired work function for both types of devices. It may be possible to address this problem by separately forming metal gate electrode of the NMOS transistor from a first material and metal gate electrode of the PMOS transistor from a second material. The first material may ensure an acceptable work function for the NMOS gate electrode, while the second material may ensure an acceptable work function for the PMOS gate electrode.

BRIEF SUMMARY

The various advantages and purposes of the exemplary embodiments as described above and hereafter are achieved by providing, according to a first aspect of the exemplary embodiments, a method of making a semiconductor device. The method includes: providing a substrate having an NMOS region and a PMOS region; forming a high-k dielectric layer over the NMOS region and the PMOS region; incorporating a metal into the high-k dielectric layer over at least one of the NMOS region and the PMOS region wherein the metal is lanthanum when incorporated into the high-k dielectric over the NMOS region and the metal is aluminum when incorporated into the high-k dielectric over the PMOS region; depositing a nitride layer or a carbide layer over the NMOS and PMOS regions; depositing a silicon layer over the nitride layer or the carbide layer; patterning a gate structure of the nitride layer or the carbide layer and the silicon layer over the NMOS and PMOS regions; forming at least one spacer adjacent to the NMOS region gate structure and on the high-k dielectric layer over the NMOS region and forming at least one spacer adjacent to the PMOS region gate structure and on the high-k dielectric layer over the PMOS region so that the high-k dielectric layer extends underneath the at least one spacer adjacent to the NMOS region and extends underneath the at least one spacer adjacent to the PMOS region; applying an interlevel dielectric between the gate structure over the NMOS region and the gate structure over the PMOS region; removing the silicon layer from the gate structure over the NMOS region and the gate structure over the PMOS region to leave an opening in the gate structures; depositing a first work function setting metal in the opening over the NMOS region and depositing a second work function setting metal in the opening over the PMOS region to partially fill the openings; and depositing a gate electrode fill metal to fill the openings in the NMOS region and the PMOS region wherein the NMOS region gate electrode fill material having a bottom and sides such that the first work function setting metal being in direct contact with the bottom and sides of the NMOS region gate electrode fill material and wherein the PMOS region gate electrode fill material having a bottom and sides such that the second work function setting metal being in direct contact with the bottom and sides of the PMOS region gate electrode fill material.

According to a second aspect of the exemplary embodiments, there is provided a method of making a semiconductor device. The method includes: providing a substrate having an NMOS region and a PMOS region; forming a high-k dielectric layer over the NMOS region and the PMOS region; incorporating a metal into the high-k dielectric layer over at least one of the NMOS region and the PMOS region wherein the metal is lanthanum when incorporated into the high-k dielectric over the NMOS region and the metal is aluminum when incorporated into the high-k dielectric over the PMOS region; depositing a nitride layer or a carbide layer over the NMOS and PMOS regions; depositing a silicon layer over the nitride layer or the carbide layer; patterning a gate structure of the nitride layer or the carbide layer and the silicon layer over the NMOS and PMOS regions; forming at least one spacer adjacent to the NMOS region gate structure and on the high-k dielectric layer over the NMOS region and forming at least one spacer adjacent to the PMOS region gate structure and on the high-k dielectric layer over the PMOS region so that the high-k dielectric layer extends underneath the at least one spacer adjacent to the NMOS region and extends underneath the at least one spacer adjacent to the PMOS region; applying an interlevel dielectric between the gate structure over the NMOS region and the gate structure over the PMOS region; removing the silicon layer from the gate structure over the NMOS region and the gate structure over the PMOS region while maintaining the nitride layer or the carbide layer in the gate structure over the NMOS region and the gate structure over the PMOS region to leave an opening in the gate structures to expose the nitride layer or the carbide layer; depositing a first work function setting metal in the opening over the NMOS region in contact with the nitride layer or the carbide layer and depositing a second work function setting metal in the opening over the PMOS region in contact with the nitride layer or the carbide layer to partially fill the openings; and depositing a gate electrode fill metal to fill the openings in the NMOS region and the PMOS region wherein the NMOS region gate electrode fill material having a bottom and sides such that the first work function setting metal being in direct contact with the bottom and sides of the NMOS region gate electrode fill material and wherein the PMOS region gate electrode fill material having a bottom and sides such that the second work function setting metal being in direct contact with the bottom and sides of the PMOS region gate electrode fill material.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIG. 1A illustrates a starting substrate having NMOS and PMOS regions;

FIG. 1B illustrates the deposition of a high-k dielectric layer;

FIG. 1C illustrates several deposited layers for modifying the composition of the high-k dielectric layer;

FIG. 1D illustrates the starting substrate with a modified high-k dielectric layer;

FIG. 1E illustrates the deposition of a nitride layer and a silicon layer on the starting substrate;

FIG. 1F illustrates the formation of dummy gates from the nitride layer and silicon layer;

FIG. 1G illustrates the formation of spacers and an interlevel dielectric layer around the dummy gates:

FIG. 1H illustrates the removal of the silicon dummy gates;

FIG. 1I illustrates the deposition of work function setting metals;

FIG. 1J illustrates the deposition of a fill metal over the work function setting metals; and FIG. 1K illustrates the planarization of the semiconductor structure.

FIG. 2A illustrates a starting substrate having NMOS and PMOS regions;

FIG. 2B illustrates the formation of dummy gates;

FIG. 2C illustrates the formation of spacers and interlevel dielectric around the dummy gates;

FIG. 2D illustrates the removal of the dummy gates;

FIG. 2E illustrates the deposition of a capping layer and a high-k dielectric layer;

FIG. 2F illustrates the deposition of work function setting metals and fill metal; and FIG. 2G illustrates the planarization of the semiconductor structure.

DETAILED DESCRIPTION

CMOS devices may be made by a "gate first" process or a "gate last" process. In a gate first process, metal layers over the NMOS and PMOS areas are formed and patterned to form gate structures followed by typical CMOS processing such as forming of the source and drain, forming spacers and depositing of the interlevel dielectric. In a gate last process, a dummy gate structure is formed followed by typical CMOS processing including formation of the source and drain, formation of spacers and deposition of the interlevel dielectric. Thereafter, the dummy gate structure is removed followed by deposition of a replacement gate structure.

Low threshold voltages are desirable for CMOS devices. However, low threshold voltages for the PMOS device are difficult to achieve with a gate first process. A gate last process is beneficial for the threshold voltage of a PMOS device but obtaining an effective work function corresponding to the silicon valence band edge is still challenging.

The present inventors have proposed semiconductor devices and methods of fabricating them wherein NMOS and PMOS devices are formed with dual gate dielectrics and dual-metal gate structures by a gate last process.

Figure 1A:
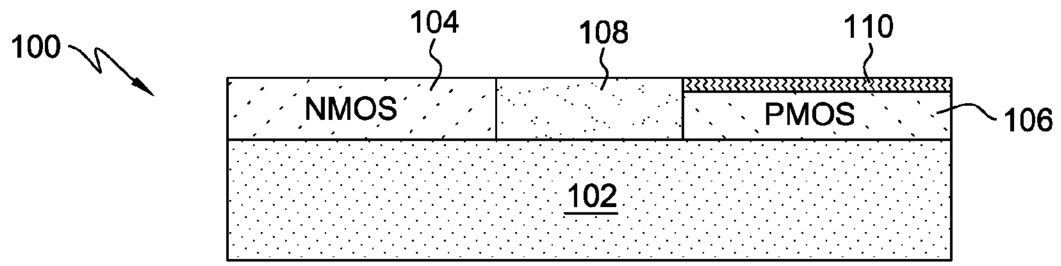
FIGS. 1A to 1K are cross sections illustrating the formation of a first exemplary embodiment of a semiconductor device where.

Referring to the Figures in more detail, and particularly referring to FIGS. 1A through 1K, there is illustrated a first exemplary embodiment employing a gate last process. A semiconductor structure 100 is to be formed which includes a semiconductor substrate 102, an NMOS area (or region) 104 and a PMOS area (or region) 106 as illustrated in FIG. 1A. While not important to the present invention, the channel area of the NMOS area 104 and PMOS area 106 may have been implanted as required by the semiconductor design.

The semiconductor material making up the semiconductor substrate 102 may be any semiconductor material, including but not limited to, silicon, silicon germanium, germanium, a III-V compound semiconductor, or a II-VI compound semiconductor. The exemplary embodiments have applicability to both silicon-on-insulator (SOI) and bulk semiconductor technology.

Separating the NMOS area 104 and the PMOS area 106 may be a shallow trench isolation (STI) area 108.

The semiconductor structure 100 may also include an optional layer of silicon germanium 110 in the PMOS area 106. The optional layer of silicon germanium 110 may be referred to later on in the processing as channel silicon germanium.

Figure 1B:
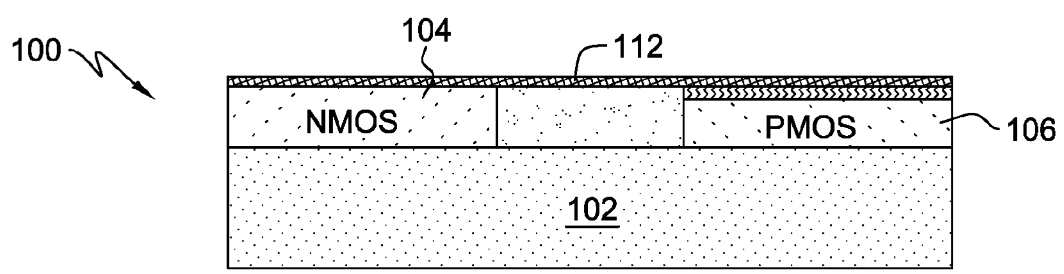

Referring now to FIG. 1B, a layer of high dielectric constant material 112 is conventionally deposited. The high dielectric constant (k) material 112 may be referred to hereafter as a high-k material. Some examples of high dielectric constant materials include but are not limited to $HfO_2$, HfON, ZrO2, ZrON, HfSiOx, HfSiON, HfZrO, HfZrON. The present inventors prefer $HfO_2$ as the high-k material. It may be deposited to a thickness of about 10 to 30 angstroms.

Figure 1C:
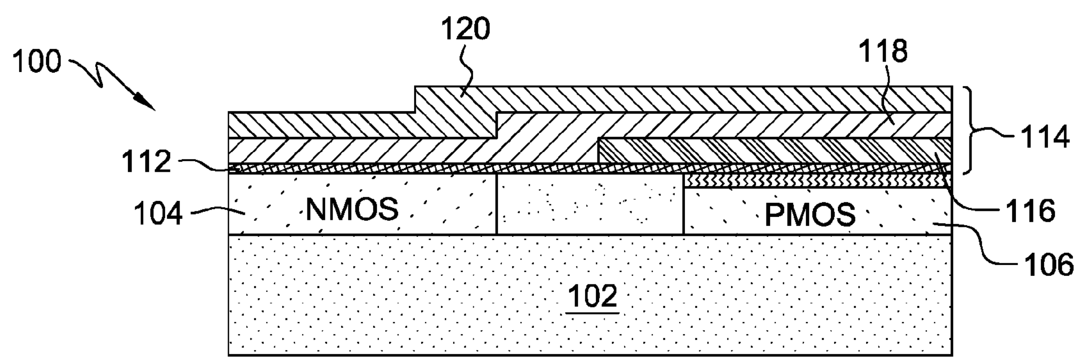

In an exemplary embodiment, one or more desirable metals are driven into the high-k material 112 overlying the NMOS area 104 and the PMOS area 106. Referring now to FIG. 1C, there is shown a multilayer structure 114 which includes layer 116 containing aluminum, layer 118 containing lanthanum and silicon layer 120. The aluminum-containing layer 116 may be about 1 to 10 angstroms thick and may contain aluminum, aluminum oxide or a mixture of aluminum and titanium nitride. The lanthanum-containing layer 118 may be about 1 to 10 angstroms thick and may contain lanthanum, lanthanum oxide or a mixture of lanthanum and titanium nitride. The semiconductor structure 100 including multilayer structure 114 may be annealed at 900-1100° C. for up to 5 seconds to drive the aluminum into the high-k dielectric layer 112 over the PMOS area 106 and drive the lanthanum into the high-k dielectric layer 112 over the NMOS area 104. The silicon layer 120 seals the multilayer structure 114 from oxidation during the annealing step. The result is to modify the high-k dielectric layer 112 into two parts so that there is a high-k dielectric layer portion 122 being enriched with aluminum and a high-k dielectric layer portion 124 being enriched with lanthanum as illustrated in FIG. 1D.

It should be understood that the principle here is to have a dual high-k dielectric layer. While the most preferred embodiment is to have an aluminum-enriched portion 122 and a lanthanum-enriched portion 124, the advantages of the invention may be achieved by having only one of the aluminum-enriched portion 122 and the lanthanum-enriched portion 124 with the other portion of the high-k dielectric layer being the originally deposited high-k dielectric layer 112. In this latter exemplary embodiment, one of the aluminum-containing layer 116 and the lanthanum-containing layer 118 would not be needed.

Figure 1D:
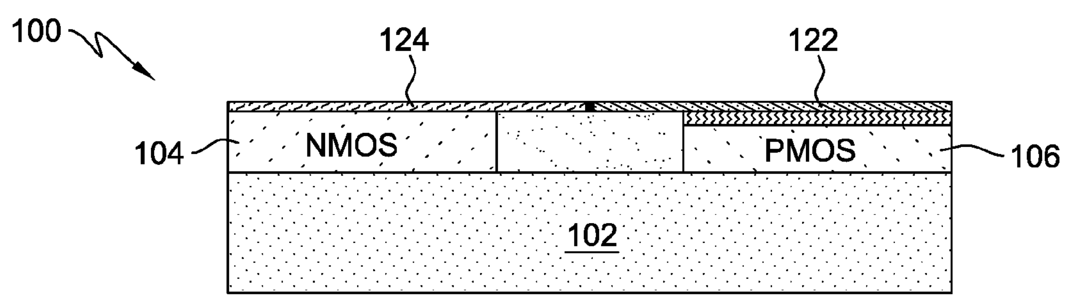
Figure 1E:
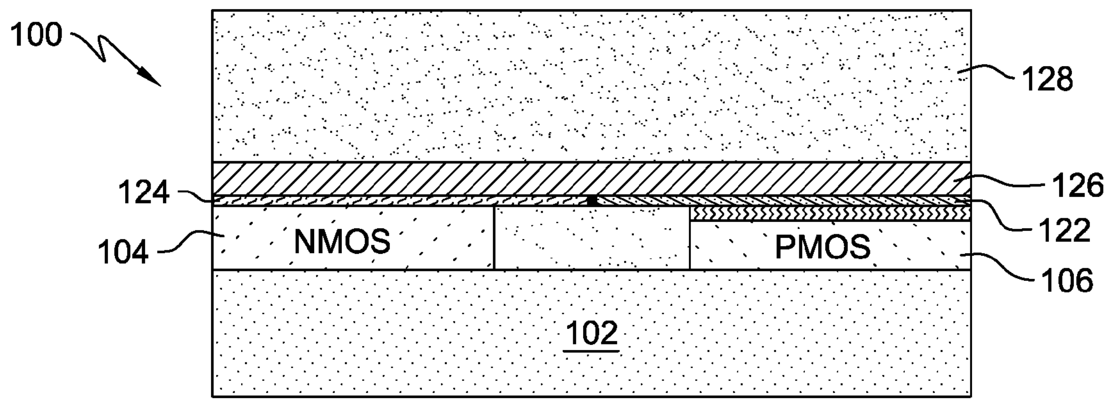

After annealing as described above, the silicon layer 120, lanthanum-containing layer 118 and aluminum-containing layer 116 would be conventionally removed by etching to result in the structure shown in FIG. 1D.

Referring now to FIG. 1E, 10 to 30 angstroms of titanium nitride, or alternatively tantalum nitride, titanium carbide or tantalum carbide is conventionally deposited to form a nitride or carbide layer 126 followed by about 60 nanometers of amorphous silicon to form amorphous silicon layer 128.

Figure 1F:
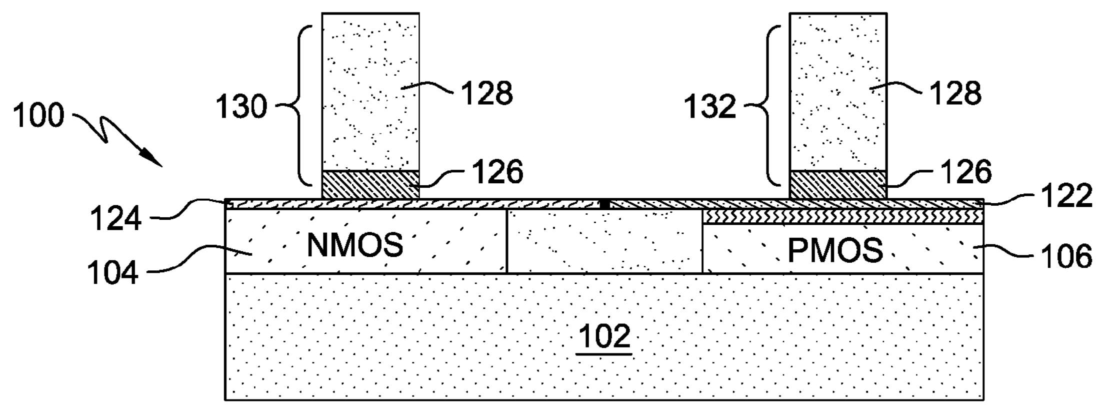

Thereafter, as shown in FIG. 1F, the titanium nitride layer 126 and the amorphous silicon layer 128 are patterned to form gate structure 130 over the NMOS area 104 and gate structure 132 over the PMOS area 106.

Figure 1G:
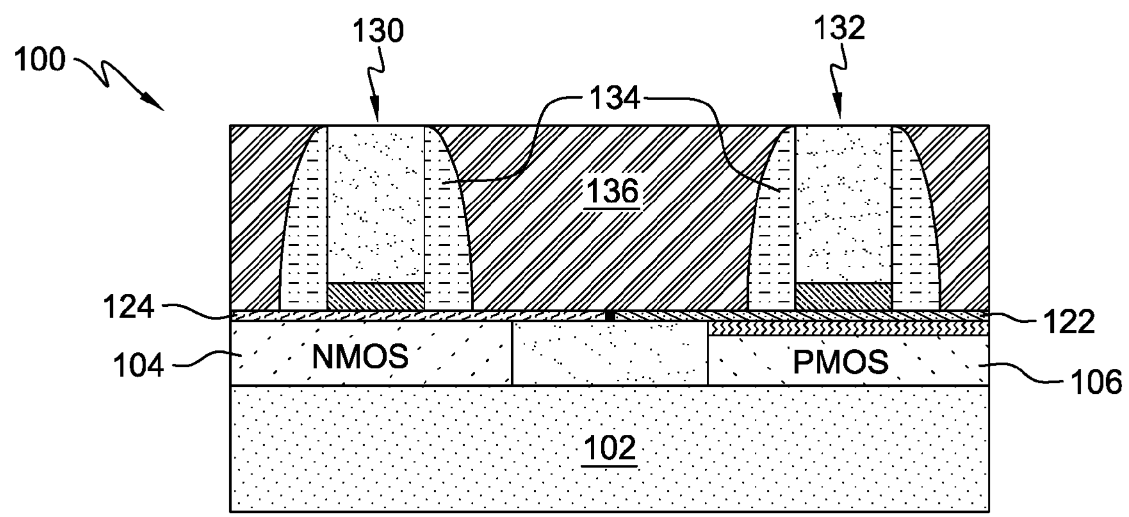

Spacers 134, such as nitride spacers, may be added in a conventional manner to the gate structures 130, 132 followed by conventional deposition of interlevel dielectric 136. The semiconductor structure 100 thus far is illustrated in FIG. 1G.

Figure 1H:
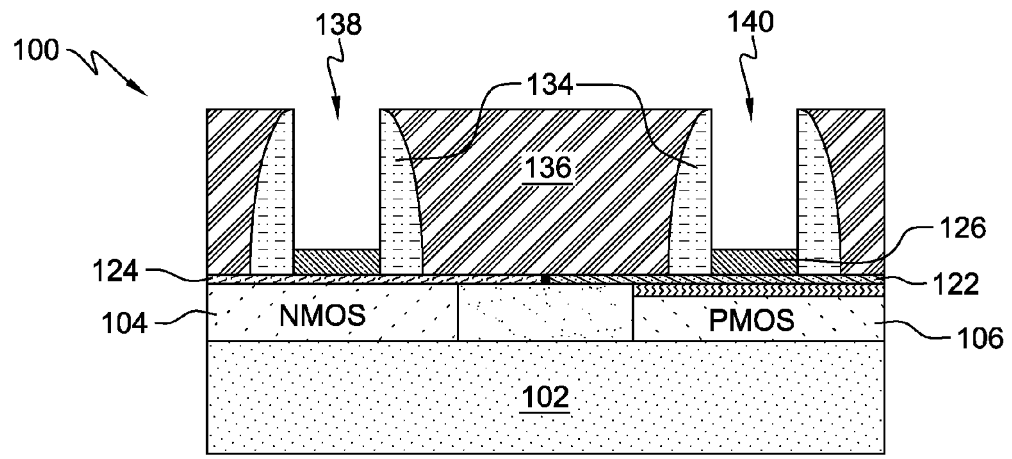

Source and drain activation may occur in the NMOS area 104 and PMOS area 106. During the source and drain activation, the amorphous silicon layer 128 is converted to polysilicon. The polysilicon within gate structures 130, 132 is a dummy gate and must be removed and replaced by a replacement gate in a gate last process according to this exemplary embodiment. The polysilicon (formerly amorphous silicon layer 128) may be removed by a wet etching chemical, such as tetramethylammonium hydroxide (TMAH), Tetraethylammonium hydroxide (TEAH), or ammonium hydroxide (NH4OH), or by a reactive ion etching process, so that opening 138 is formed in gate structure 130 and opening 140 is formed in gate structure 132 as shown in FIG. 1H.

Figure 1I:
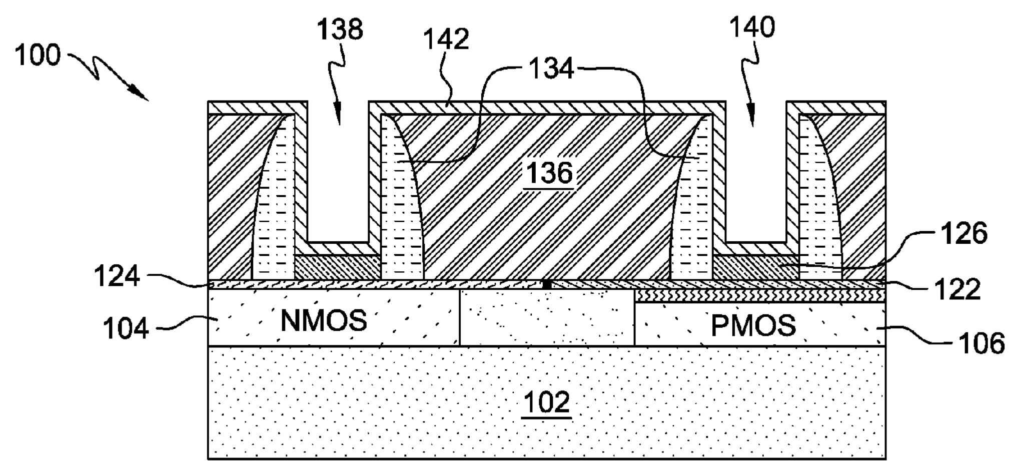

Work function setting metals, generally indicated by layer 142, are then deposited within openings 138, 140. The individual layers that constitute the work function metals, as described hereafter, are not shown for clarity. The work function setting metals in opening 138 set the work function around the silicon conduction band edge while the work function metals in opening 140 set the work function around the silicon valence band edge. Within opening 138, 10 to 30 angstroms of tantalum nitride followed by 10 to 40 angstroms of titanium aluminum are deposited. Alternatively, titanium aluminum nitride, tantalum aluminum, tantalum aluminum nitride, hafnium silicon alloy, hafnium nitride, or tantalum carbide may be deposited within opening 138 instead of the titanium aluminum. Within opening 140, 10 to 30 angstroms of tantalum nitride, followed by 30 to 70 angstroms of titanium nitride and 10 to 40 angstroms of titanium aluminum are deposited. Alternatively, tungsten, tantalum nitride, ruthenium, platinum, rhenium, iridium, or palladium may be deposited within opening 140 instead of the titanium nitride and titanium aluminum nitride, tantalum aluminum, tantalum aluminum nitride, hafnium silicon alloy, hafnium nitride, or tantalum carbide may be deposited within opening 140 instead of the titanium aluminum. The work function metals may be conformally deposited, as shown in FIG. 1I, or may be nonconformally deposited.

Figure 1J:
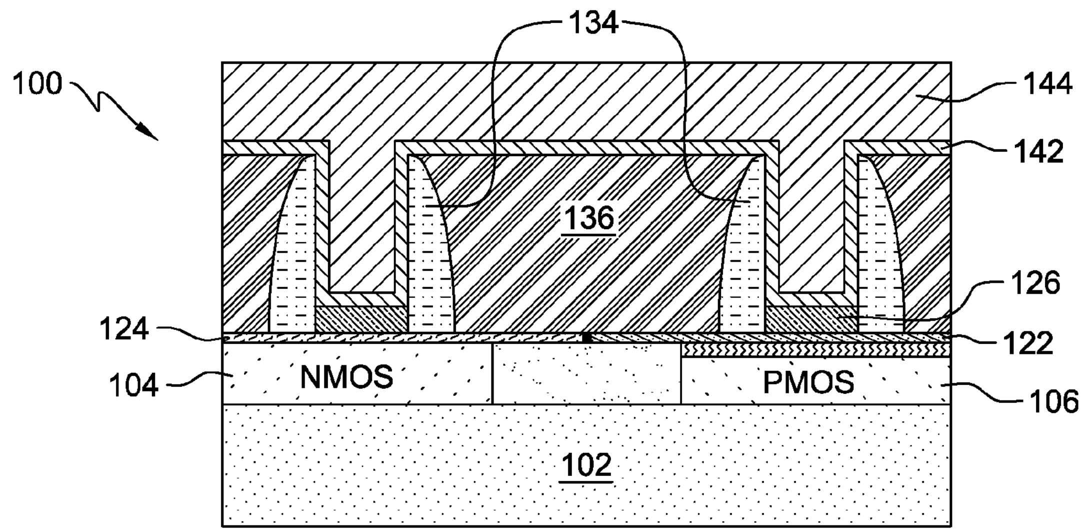
Figure 1K:
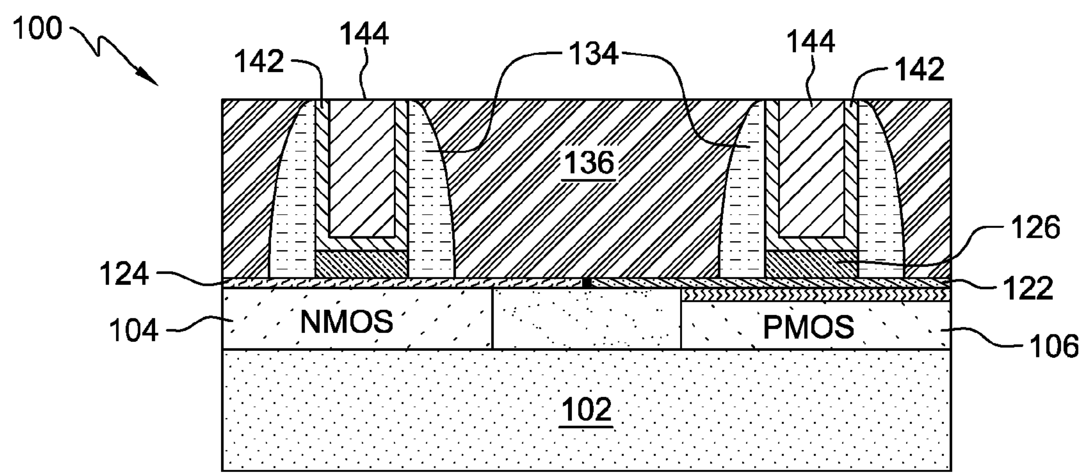

Referring now to FIG. 1J, the remainder of the openings 138, 140 are filled with a fill metal 144, such as aluminum, titanium-doped aluminum, tungsten, or copper The semiconductor structure 100 is then planarized by a process such as chemical mechanical polishing, FIG. 1K.

Further middle of the line and back end of the line semiconductor processing may then follow.

Figure 3:
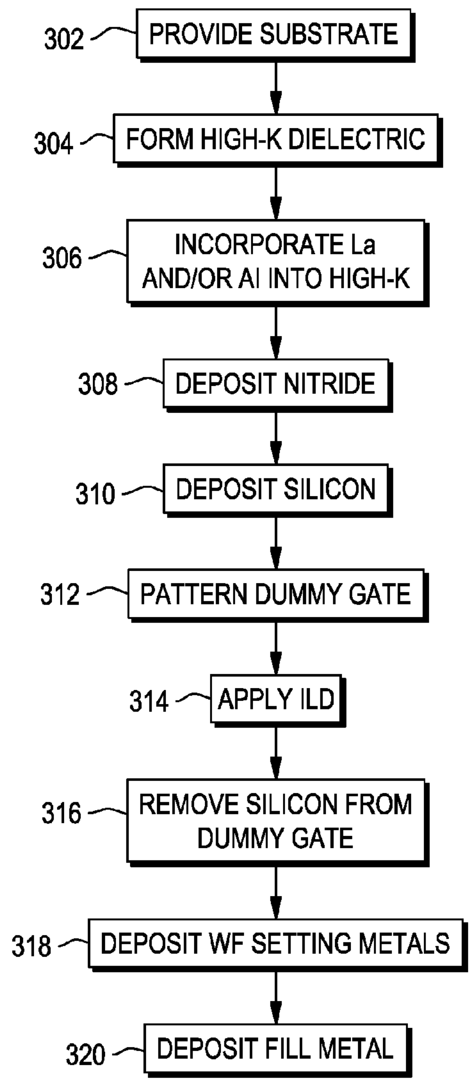
FIG. 3 illustrates a process flow for fabricating the first exemplary embodiment.

A process flow for the first exemplary embodiment is illustrated in FIG. 3. The process flow begins by providing a substrate having an NMOS region and a PMOS region, box 302.

A high-k dielectric is formed over the NMOS region and the PMOS region, box 304.

Then, lanthanum may be incorporated into the high-k dielectric over the NMOS region or aluminum may be incorporated into the high-k dielectric over the PMOS region or both lanthanum may be incorporated into the high-k dielectric over the NMOS region and aluminum may be incorporated into the high-k dielectric over the PMOS region, box 306.

A layer of titanium nitride is deposited over the NMOS and PMOS regions, box 308, followed by deposition of silicon over the nitride layer, box 310.

The nitride and silicon layers are patterned to form a dummy gate, box 312.

Spacers may then be applied to the dummy gate, if desired, followed by depositing an oxide interlevel dielectric, box 314.

The silicon is removed from the dummy gates over the NMOS and PMOS areas by a suitable etching process, box, 316.

A replacement gate process commences wherein work function setting metals are deposited to partially fill the open areas left from the removal of the silicon, box 318, followed by deposition of fill metal to fill the remainder of the open areas and complete the replacement gate process, box 320.

Figure 2A:
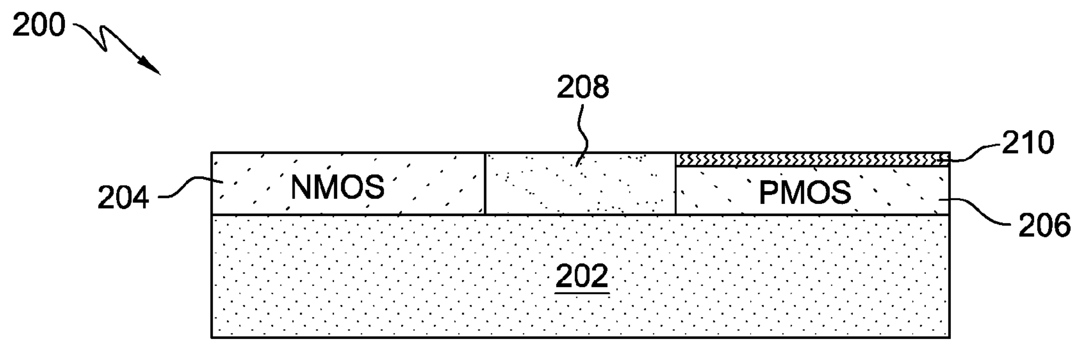
FIGS. 2A to 2G are cross sections illustrating the formation of a second exemplary embodiment of a semiconductor device where.

A second exemplary embodiment employing a gate last process is illustrated in FIGS. 2A to 2G. The starting structure for this exemplary embodiment as shown in FIG. 2A is substantially similar to the structure shown in FIG. 1A. That is, a semiconductor structure 200 is to be formed which includes a semiconductor substrate 202, an NMOS area (or region) 204 and a PMOS area (or region) 206.

The semiconductor material making up the semiconductor substrate 202 may be any semiconductor material, including but not limited to, silicon, silicon germanium, germanium, a III-V compound semiconductor, or a II-VI compound semiconductor. The present invention has applicability to both silicon-on-insulator (SOI) and bulk semiconductor technology.

Separating the NMOS area 204 and the PMOS area 206 may be a shallow trench isolation (STI) area 208.

The semiconductor structure 200 may also include an optional layer of silicon germanium 210 in the PMOS area 206. The optional layer of silicon germanium 210 may be referred to later on in the processing as channel silicon germanium.

Figure 2B:
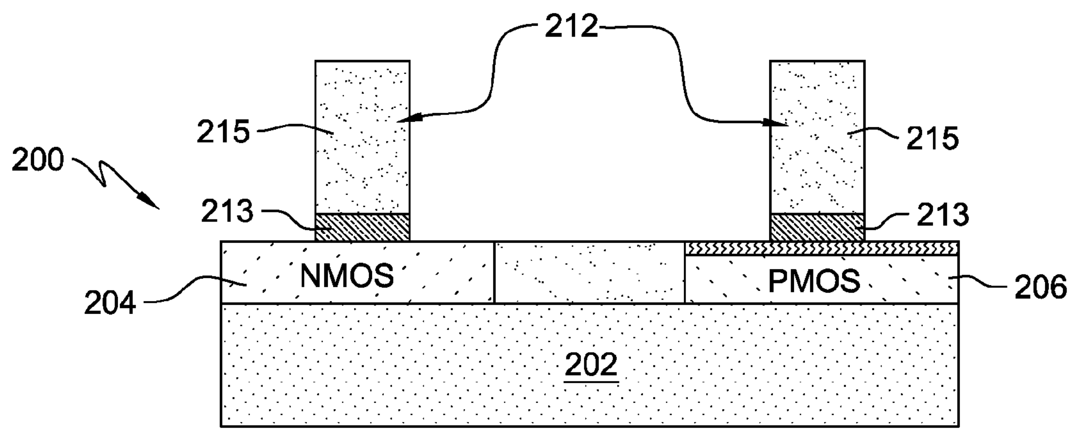

Referring now to FIG. 2B, dummy gate structures 212, which will be removed in a subsequent process, are shown. The dummy gate structures 212 have been formed from a dummy oxide 213 and a 60 nm thick layer of either amorphous or polycrystalline silicon which has been conventionally blanket deposited and then patterned. The dummy oxide may be silicon oxide grown by atomic layer deposition (ALD) or by anneal (rapid thermal anneal, furnace anneal) under an oxygen ambient. The dummy oxide may be nitrided by either rapid thermal anneal or plasma nitridation.

Figure 2C:
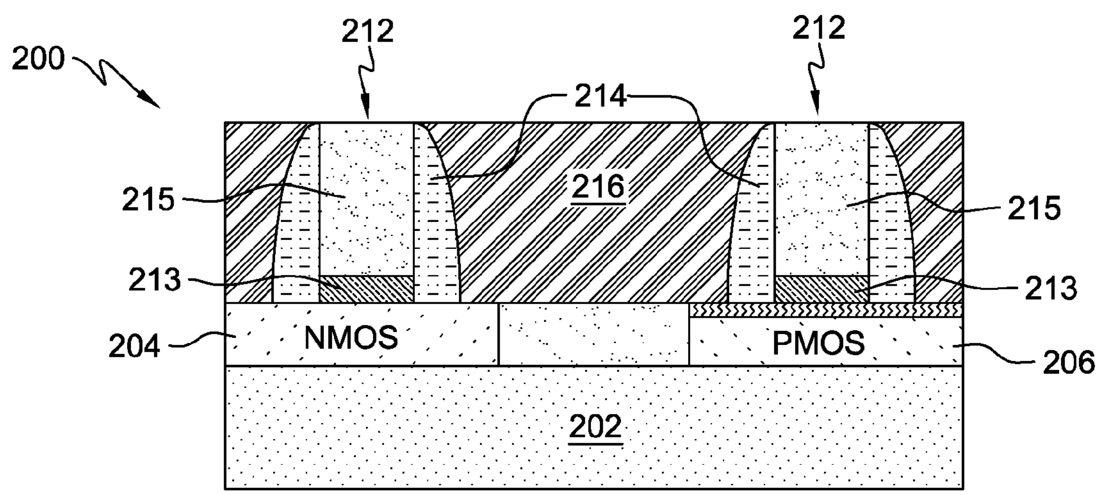

As shown in FIG. 2C, insulating spacers 214, such as nitride spacers, have been added to the dummy gate structures 212 and then an interlevel dielectric 216, such as an oxide, has been blanket deposited and then planarized by stopping on the dummy gate structures 212.

Figure 2D:
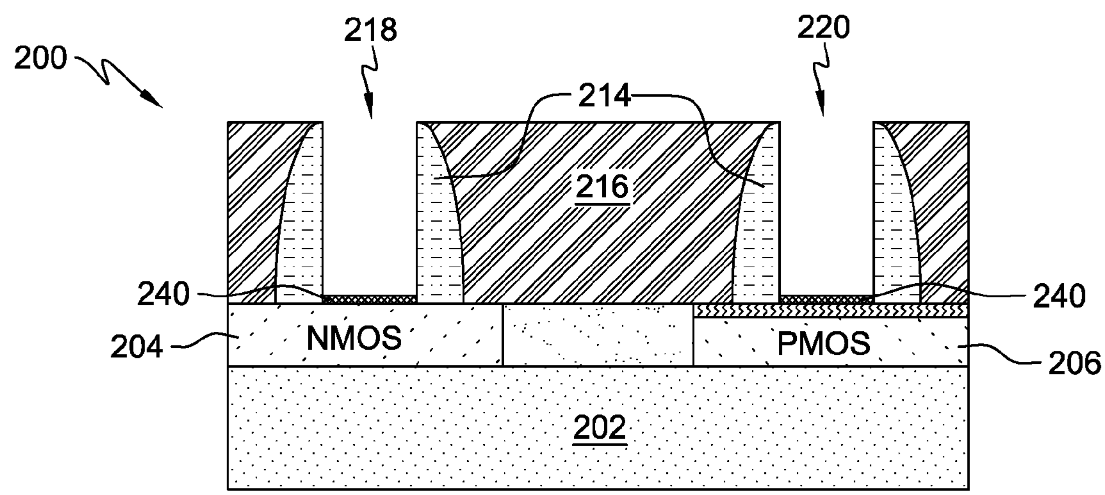

Dummy gate structures 212 are removed by a wet etching chemical, such as tetramethylammonium hydroxide (TMAH), Tetraethylammonium hydroxide (TEAH), or ammonium hydroxide (NH4OH), or by a reactive ion etching process, followed by a removal of the dummy oxide using a wet etching chemical. such as diluted hydrofluoric acid (DHF) or buffered hydrofluoric acid (BHF) to result in opening 218 over the NMOS area 204 and opening 220 over the PMOS area 206 in the semiconductor structure 200 as illustrated in FIG. 2D. An interfacial layer 240 of silicon oxide is conventionally grown at the bottom of the openings 218, 220 by, for example, oxidizing the silicon in NMOS area 204 and PMOS area 206.

Figure 2E:
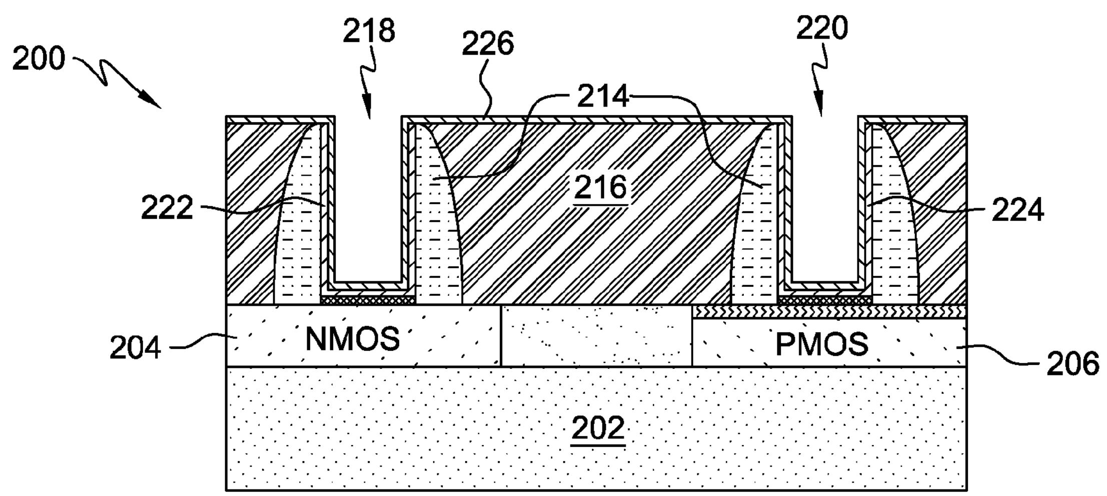

Thereafter, a cap layer may be added in opening 218 or opening 220 or both opening 218 and opening 220. The cap layer 222 in the opening 218 may be a 1 to 10 angstrom thick layer of lanthanum oxide while the cap layer 224 in the opening 220 may be a 1 to 10 angstrom thick layer of aluminum oxide. While both cap layer 222 and cap layer 224 are shown in FIG. 2E as a preferred embodiment, it should be understood that the advantages of the invention may be achieved while using only one of the cap layers 222, 224 since an advantage of the invention is to have dual gate dielectrics and this may be achieved by using only one of the cap layers 222, 224.

The cap layer 222 may be applied by depositing cap layer 222 everywhere, blocking the NMOS area 204 and then removing the cap layer 222 from the PMOS area 206 by a suitable etching process, such as diluted hydrochloric acid (HCl) Similarly, the cap layer 224 may be applied by blanket depositing cap layer 224 everywhere, blocking the PMOS area 206 and then removing the cap layer 224 from the NMOS area 204 by a suitable etching process, such as diluted ammonia hydroxide (NH4OH) The order of depositing cap layers 222, 224 is not important and so the cap layer 224 may be deposited and patterned first followed by depositing and patterning cap layer 222.

Next, a high-k dielectric such as those mentioned in the first exemplary embodiment is deposited. For purposes of illustration and not limitation, high-k dielectric layer 226 is a 10 to 30 angstrom thick layer of hafnium oxide. The high-k dielectric layer 226 must be applied over the cap layer(s) as shown in FIG. 2E.

Cap layers 222, 224 and high-k dielectric 226 may be applied conformally or nonconformally. As shown in FIG. 2E, these layers have been deposited conformally.

Work function setting metals layers 228, 230, respectively, must be deposited in the openings 218 and 220. The individual work function metals that constitute the work function setting metals layers 228, 230, as described hereafter, are not shown for clarity. The work function setting metals in opening 218 set the work function around the silicon conduction band edge while the work function metals in opening 220 set the work function around the silicon valence band edge. In opening 218 over the NMOS area 204, optional layers of 10 to 30 angstrom thick titanium nitride and 10 to 30 angstrom thick tantalum nitride are deposited followed by a nonoptional 10 to 40 angstrom thick layer of titanium aluminum, which together make up the work function setting metal layer, generally indicated by 228. Alternatively, titanium aluminum nitride, tantalum aluminum, tantalum aluminum nitride, hafnium silicon alloy, hafnium nitride, or tantalum carbide may be deposited in opening 218 instead of the titanium aluminum. In opening 220 over the PMOS area 206, optional layers of 10 to 30 angstrom thick titanium nitride and 10 to 30 angstrom thick tantalum nitride are deposited followed by nonoptional layers of 30 to 70 angstrom thick titanium nitride and 10 to 40 angstrom thick layer of titanium aluminum, which together make up the work function setting metal layer, generally indicated by 230. Alternatively, tungsten, tantalum nitride, ruthenium, platinum, rhenium, iridium, or palladium may be deposited in opening 220 instead of the titanium nitride and titanium aluminum nitride, tantalum aluminum, tantalum aluminum nitride, hafnium silicon alloy, hafnium nitride, or tantalum carbide may be deposited in opening 220 instead of the titanium aluminum.

The work function setting metal layers 228, 230 may be deposited as follows: deposit the optional layer of titanium nitride everywhere, deposit the optional layer of tantalum nitride everywhere, deposit the layer of titanium nitride layer everywhere, remove the last layer of titanium nitride from the NMOS area 204 and deposit titanium aluminum everywhere.

Figure 2F:
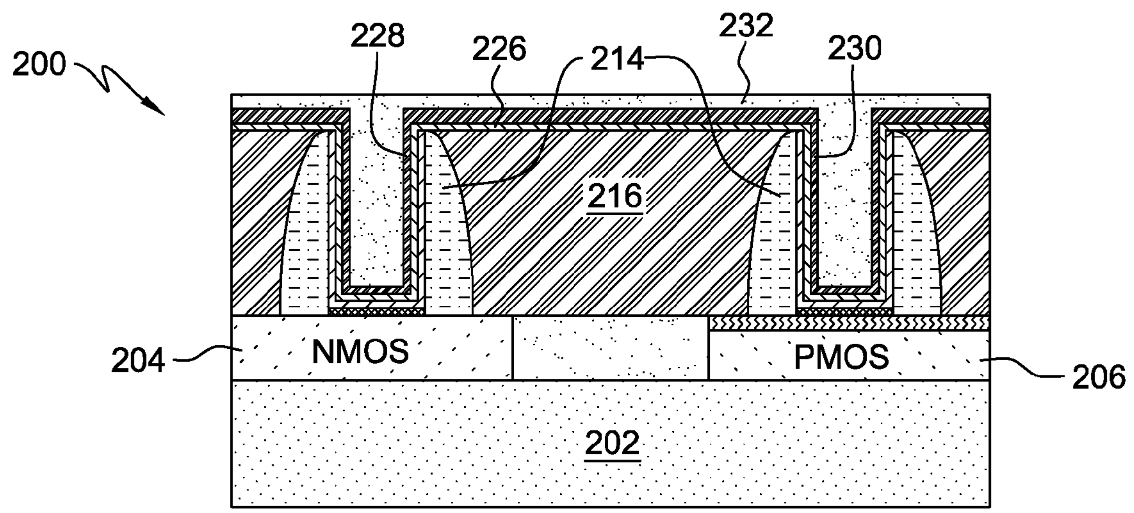

The remainder of openings 218, 220 is filled with a fill metal such as aluminum, titanium-doped aluminum, tungsten or copper (layer 232) to result in the structure shown in FIG. 2F.

Figure 2G:
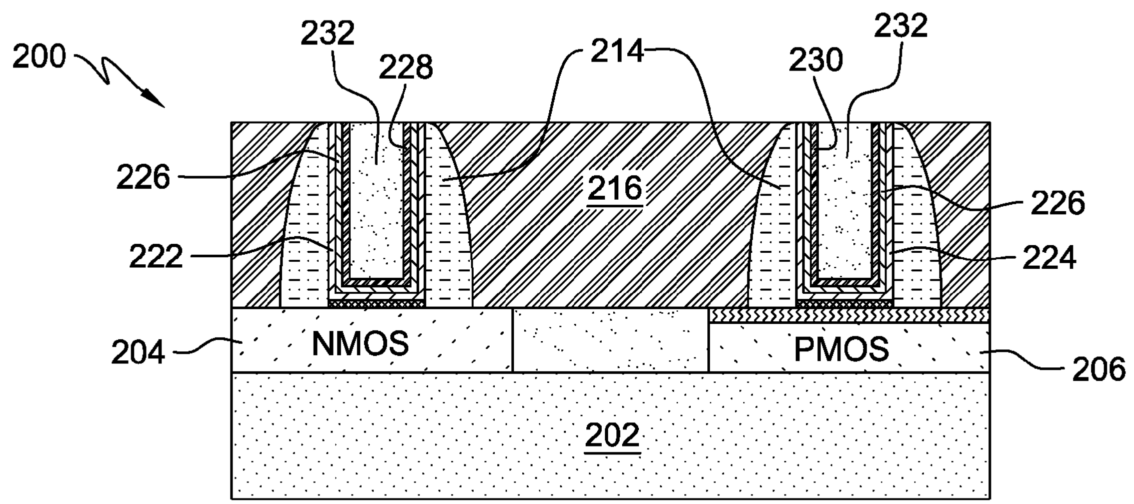

The overburden of the fill metal layer 232, the work function setting metals 228, 230 and any high-k dielectric layer 226 and cap layers 222, 224 are removed by a conventional chemical mechanical polishing process to result in the structure shown in FIG. 2G.

Further middle of the line and back end of the line semiconductor processing would then follow.

Figure 4:
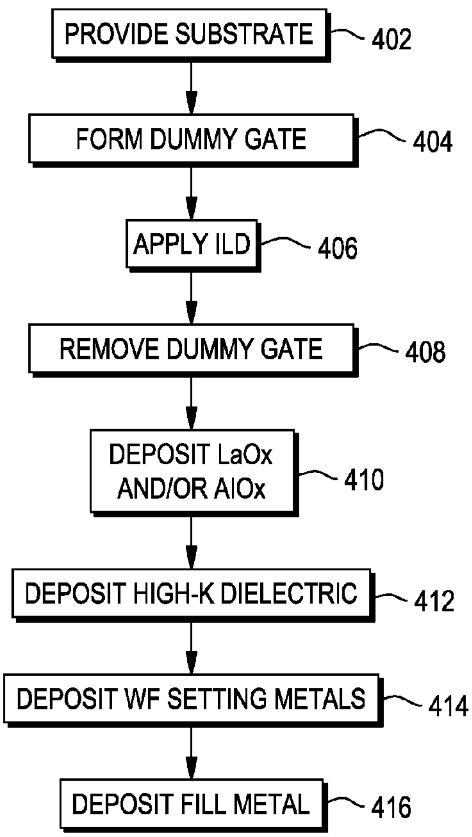
FIG. 4 illustrates a process flow for fabricating the second exemplary embodiment.

A process flow for the second exemplary embodiment is illustrated in FIG. 4. The process flow begins by providing a substrate having an NMOS region and a PMOS region, box 402.

A dummy gate structure is then formed, box 404.

Spacers may then be applied to the dummy gate, if desired, followed by depositing an oxide interlevel dielectric, box 406.

The dummy gate structure is removed by a suitable etching process to leave open areas where the dummy gate structure used to be, box 408.

The open areas left from the removal of the dummy gate structure are filled with replacement gates. The replacement gate process begins with the deposition of lanthanum oxide in the open area over the NMOS region or deposition of aluminum oxide in the open area over the PMOS region or both lanthanum oxide in the open area over the NMOS region and deposition of aluminum oxide in the open area over the PMOS region, box 410.

High-k dielectric is then deposited in the open areas and over the lanthanum oxide (if present) and the aluminum oxide (if present), box 412.

Then, work function setting metals are deposited to partially fill the open areas, box 414, followed by deposition of fill metal to fill the remainder of the open areas and complete the replacement gate process, box 416.

The semiconductor structures 100, 200 have been shown as being planarized. It is also within the scope of the present exemplary embodiments to apply the exemplary embodiments to a nonplanar FinFET structure. The metals must be able to be applied conformally. Instead of filling the openings with titanium aluminum, instead an aluminum-containing conformal metal such a titanium aluminum nitride or tantalum aluminum nitride is conformally applied.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of making a semiconductor device comprising:

providing a substrate having an NMOS region and a PMOS region;

forming a high-k dielectric layer over the NMOS region and the PMOS region;

incorporating a metal into the high-k dielectric layer over at least one of the NMOS region and the PMOS region wherein the metal is lanthanum when incorporated into the high-k dielectric over the NMOS region and the metal is aluminum when incorporated into the high-k dielectric over the PMOS region;

depositing a nitride layer or a carbide layer over the NMOS and PMOS regions;

depositing a silicon layer over the nitride layer or the carbide layer;

patterning a gate structure of the nitride layer or the carbide layer and the silicon layer over the NMOS and PMOS regions;

forming at least one spacer adjacent to the NMOS region gate structure and on the high-k dielectric layer over the NMOS region and forming at least one spacer adjacent to the PMOS region gate structure and on the high-k dielectric layer over the PMOS region so that the high-k dielectric layer extends underneath the at least one spacer adjacent to the NMOS region and extends underneath the at least one spacer adjacent to the PMOS region;

applying an interlevel dielectric between the gate structure over the NMOS region and the gate structure over the PMOS region;

removing the silicon layer from the gate structure over the NMOS region and the gate structure over the PMOS region to leave an opening in the gate structures;

depositing a first work function setting metal in the opening over the NMOS region and depositing a second work function setting metal in the opening over the PMOS region to partially fill the openings; and depositing a gate electrode fill metal to fill the openings in the NMOS region and the PMOS region wherein the NMOS region gate electrode fill material having a bottom and sides such that the first work function setting metal being in direct contact with the bottom and sides of the NMOS region gate electrode fill material and wherein the PMOS region gate electrode fill material having a bottom and sides such that the second work function setting metal being in direct contact with the bottom and sides of the PMOS region gate electrode fill material.

2. The method of claim 1 wherein the first high-k gate dielectric includes lanthanum.

3. The method of claim 1 wherein the second high-k gate dielectric includes aluminum.

4. The method of claim 1 wherein the first high-k gate dielectric includes lanthanum and wherein the second high-k gate dielectric includes aluminum.

5. The method of claim 1 wherein the first work function setting metal comprises aluminum or titanium aluminum and the second work function setting metal comprises titanium nitride.

6. The method of claim 1 wherein the first work function setting metal sets the work function at the silicon conduction band edge and the second work function setting metal sets the work function at the silicon valence band edge.

7. The method of claim 1 wherein the PMOS region further includes a layer of silicon germanium underneath the high-k gate dielectric.

8. The method of claim 1 wherein the first high-k gate dielectric is selected from the group consisting of $HfO_2$, HfON, $ZrO_2$, ZrON, $HfSiO_x$, HfZrO and HfZrON and the second high-k gate dielectric is selected from the group consisting of $HfO_2$, HfON, $ZrO_2$, ZrON, $HfSiO_x$, HfZrO and HfZrON.

9. The method of claim 1 wherein the gate electrode fill metal is selected from the group consisting of aluminum, titanium-doped aluminum, tungsten and copper.

10. The method of claim 1 wherein in the step of depositing a silicon layer over the nitride layer or the carbide layer, the silicon of the silicon layer is an amorphous silicon and further comprising converting the amorphous silicon to polysilicon prior to removing the silicon layer from the gate structure.

11. A method of making a semiconductor device comprising:

providing a substrate having an NMOS region and a PMOS region;

forming a high-k dielectric layer over the NMOS region and the PMOS region;

incorporating a metal into the high-k dielectric layer over at least one of the NMOS region and the PMOS region wherein the metal is lanthanum when incorporated into the high-k dielectric over the NMOS region and the metal is aluminum when incorporated into the high-k dielectric over the PMOS region;

depositing a nitride layer or a carbide layer over the NMOS and PMOS regions;

depositing a silicon layer over the nitride layer or the carbide layer;

patterning a gate structure of the nitride layer or the carbide layer and the silicon layer over the NMOS and PMOS regions;

forming at least one spacer adjacent to the NMOS region gate structure and on the high-k dielectric layer over the NMOS region and forming at least one spacer adjacent to the PMOS region gate structure and on the high-k dielectric layer over the PMOS region so that the high-k dielectric layer extends underneath the at least one spacer adjacent to the NMOS region and extends underneath the at least one spacer adjacent to the PMOS region;

applying an interlevel dielectric between the gate structure over the NMOS region and the gate structure over the PMOS region;

removing the silicon layer from the gate structure over the NMOS region and the gate structure over the PMOS region while maintaining the nitride layer or the carbide layer in the gate structure over the NMOS region and the gate structure over the PMOS region to leave an opening in the gate structures to expose the nitride layer or the carbide layer;

depositing a first work function setting metal in the opening over the NMOS region in contact with the nitride layer or the carbide layer and depositing a second work function setting metal in the opening over the PMOS region in contact with the nitride layer or the carbide layer to partially fill the openings; and depositing a gate electrode fill metal to fill the openings in the NMOS region and the PMOS region wherein the NMOS region gate electrode fill material having a bottom and sides such that the first work function setting metal being in direct contact with the bottom and sides of the NMOS region gate electrode fill material and wherein the PMOS region gate electrode fill material having a bottom and sides such that the second work function setting metal being in direct contact with the bottom and sides of the PMOS region gate electrode fill material.

12. The method of claim 11 wherein the first high-k gate dielectric includes lanthanum.

13. The method of claim 11 wherein the second high-k gate dielectric includes aluminum.

14. The method of claim 11 wherein the first high-k gate dielectric includes lanthanum and wherein the second high-k gate dielectric includes aluminum.

15. The method of claim 11 wherein the first work function setting metal comprises aluminum or titanium aluminum and the second work function setting metal comprises titanium nitride.

16. The method of claim 11 wherein the first work function setting metal sets the work function at the silicon conduction band edge and the second work function setting metal sets the work function at the silicon valence band edge.

17. The method of claim 11 wherein the PMOS region further includes a layer of silicon germanium underneath the high-k gate dielectric.

18. The method of claim 11 wherein the first high-k gate dielectric is selected from the group consisting of $HfO_2$, HfON, $ZrO_2$, ZrON, $HfSiO_x$, HfZrO and HfZrON and the second high-k gate dielectric is selected from the group consisting of $HfO_2$, HfON, $ZrO_2$, ZrON, $HfSiO_x$, HfZrO and HfZrON.

19. The method of claim 11 wherein the gate electrode fill metal is selected from the group consisting of aluminum, titanium-doped aluminum, tungsten and copper.

20. The method of claim 11 wherein in the step of depositing a silicon layer over the nitride layer or the carbide layer, the silicon of the silicon layer is an amorphous silicon and further comprising converting the amorphous silicon to polysilicon prior to removing the silicon layer from the gate structure.

* * * * *